United States Patent [19]

Petersen

[11] 4,109,207

[45] Aug. 22, 1978

[54] CODING MEMBER FOR PROGRAMMING OF A RADIO COMMUNICATION APPARATUS

[75] Inventor: Ole Simon Petersen, Aalborg, Denmark

[73] Assignee: S. P. Radio A/S, Aalborg, Denmark

[21] Appl. No.: 736,246

[22] Filed: Oct. 27, 1976

[51] Int. Cl.² .................. G08C 9/08; H01H 19/63; H04B 1/06
[52] U.S. Cl. .................. 325/455; 200/153 L; 340/347 P
[58] Field of Search .............. 325/455; 340/347 P; 116/115; 74/567, 568; 200/46, 31 R, 153 L, 35 B, 37 A, 38 CA

[56] References Cited

U.S. PATENT DOCUMENTS

| 2,257,537 | 9/1941 | Samburg | 200/38 CA |
| 3,128,909 | 4/1964 | Shield | 200/38 CA |
| 4,015,253 | 3/1977 | Goldstein | 325/455 |

Primary Examiner—Howard W. Britton

Attorney, Agent, or Firm—Strauch, Nolan, Neale, Nies & Kurz

[57] ABSTRACT

A disc shape rotatable coding member for programming of a radio communication apparatus. The coding member has notches or teeth around its periphery which cooperate with a detent and permit indexing selection of disc positions that are indicated by a number of radials, intersected by a number of imaginary circles, each forming a row of spaces, thus rendering intersection points between the radials and the circle. The intersection points may be provided with empty spaces without holes, empty space with threaded holes, permanent projections in the shape of pressed-up protrusions, or of semipermanent projections in the shape of screws placed in the threaded holes. These screws may be placed in such a way that the screw head forms the protrusion or in such a way that the threaded part of the screw forms the protrusion. The protrusions (permanent or semi-permanent) in each radial constitute a code and serve as contacts which cooperate with selected switch contacts to provide an electrical code condition which can be used to program a radio communication apparatus.

6 Claims, 4 Drawing Figures

CODING MEMBER FOR PROGRAMMING OF A RADIO COMMUNICATION APPARATUS

BACKGROUND OF THE INVENTION

The present invention relates to a coding member for programming of a radio communication apparatus in which the frequency selected is synthesized using a programmable frequency divider with a dividing figure N and in which the coding member mainly serves as adjustment of the dividing figure N for each frequency channel. The coding member is equipped with an indexing mechanism enabling the coding member to be kept in a number of positions, each of which corresponds to a communication channel.

The particular frequency bands available for radio communication are governed partly by international regulations concerning the frequencies for the various communication channels and the use of these channels for simplex and duplex communication etc., and partly by special national rules concerning distribution and use of the channels.

Programming systems for such radio communication apparatus are known, in which the dividing figure N for the synthesis of the frequency demanded is provided by a coding member and by which other setting devices ensure fulfilment of other demanded or selected functions.

The present invention is related to the construction of a coding member for programming of a radio communication apparatus, enabling the setting to be operated not only in compliance with all international and national regulations concerning frequency selection, but also observing the rules for simplex or duplex operation of the channels and various other rules, all carried out by a single coding member in such a way that any unintended violation of the regulations is avoided.

It may be mentioned as examples of such regulations that in the channels number 15 and 17, adjacent to the calling channel number 16, only reduced transmitter output power is allowed. According to this regulation. a special row of spaces is reserved on the coding member. The intersection points between the radials corresponding to the channels 15 and 17 and this row of spaces consist of empty spaces, which make impossible insertion of projections that would prevent the power reduction demanded for these channels. Moreover, one or more channels can be blocked in transmitter and receiver or in transmitter only for export to countries where such interventions are demanded. Furthermore, the coding member can be programmed in such a way that an external information can be given for one or more randomly selected channels, e.g. in order to block a spare receiver, which might be demanded at riverborne traffic.

This is achieved by a coding member for programming of a radio communication apparatus, in which the frequency selected is synthesized using a programmable frequency divider with a dividing figure N, and in which the coding member may be secured in a number of positions using an indexing mechanism, each position corresponding to a communication channel. The coding member is provided with a number of rows of spaces placed in a direction which is mainly perpendicular to that in which the coding member is moved when adjusted to a particular channel, and the intersection points on the coding member between a radial corresponding to a communication channel and a row of spaces will be either an empty space, an empty space, with a thread hole, or a projection. The projections may be either permanent or semi-permanent. The presence of a protrusion or projection will result in closing a contact in a set of contacts corresponding to the number of rows of spaces.

Due to the possibility of arranging empty spaces that can be occupied neither by permanent nor by semi-permanent projections, changes prohibited according to international conditions are prevented from being carried out.

Due to the presence on the coding member of both permanent and semi-permanent projections, the communication apparatus irrespective of what country it has to be exported to, can be produced with one and the same coding member and only semi-permanent projections have to be inserted into the coding member according to special requirements of an individual customer.

This has the effect that communication devices become more simple for the operator to adjust, and they become simple to code in such a way that they comply with the requirements of the authorities and the buyer, and also the price of production is reduced by the rationalization.

By means of making the coding member as a plane, circular disc, pivotable around an axis perpendicular to and protruding through the center of the disc, and providing the disc periphery with notches to participate in the formation of the indexing mechanism, it is obtained that in spite of the fact that the coding member takes up only a modest amount of space, it is still accurately adjustable.

By means of making the above mentioned coding member with the permanent projections constituted by the deformation of the coding member, e.g., by pressed-up protrusions in the disc which forms the coding member, it is obtained that the production of the coding member becomes simple and inexpensive, which is due to the fact that the deformation of the coding member for addition of permanent projections may be made in one operation using a specially adapted tool.

By means of making the above mentioned coding member with the semi-permanent projections consisting of screws, mounted in threaded holes in the coding member, it is obtained that the semi-permanent projections become inexpensive and also easily interchangeable, and that the change requires a minimum amount of tools, i.e. only a screwdriver.

By means of making the aforementioned coding member with a number of radials on the coding member provided with threaded holes, at least where the intersection points of the combinations decide the dividing figure N, and possibly also at the intersection points of those combinations allocated to the special conditions, it is obtained that the communication apparatus may be adjusted to one or more channels specially allocated or later released for a particular service by the use of semi-permanent projections.

In order that the invention may be fully understood and readily carried into effect it will now be described with reference to the accompanying drawings of which:

Figure 1:
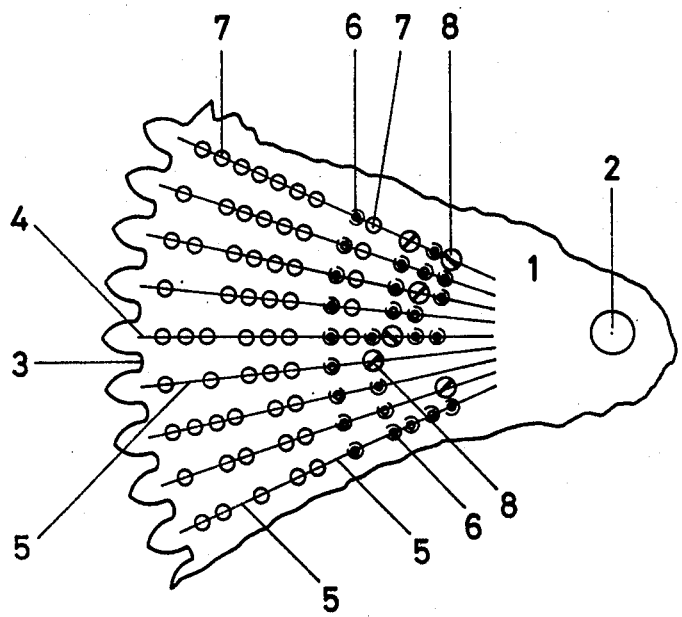
FIG. 1 shows a segment of one embodiment of the invention
Figure 2:
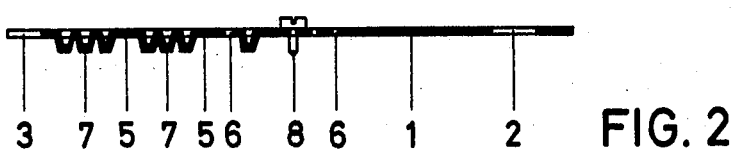
FIG. 2 shows a section through the same.

In FIGS. 1 & 2, 1 is a coding member having the shape of a plane, circular disc e.g. made of brass. The disc has an axial bore 2 allowing it to be pivotally connected to an axle not further described, but perpendicular to the disc. Along its periphery the coding member 1 has a number of notches 3 enabling a not shown, spring-loaded roll to form an indexing mechanism by means of which the coding member may be secured in a number of positions that are indicated by a number of radials 4. The radials 4 are intersected by a number of imaginary circles, each forming a row of spaces, thus rendering intersection points between the radials and the circle. The intersection points may be provided with empty spaces 5 without holes, empty spaces 6 with threaded holes, permanent projections 7 in the shape of pressed-up protrusions, or finally of semi-permanent projections 8 in the shape of screws placed in the threaded holes. These screws may be placed in such a way that the screw head forms the protrusion or in such a way that the threaded part of the screw forms the protrusion. As seen from FIG. 2, the latter is the case for the shown coding member.

In FIG. 1 it is the eight circles having the greatest diameter that are reserved for binary synthesis of the dividing figure N, as each of the circles corresponds to a power of 2, increasing from 0 to 7. The remainder of the circles shown are reserved to each of the functions mentioned above or are reserved to similar functions.

Figures 3, 4:
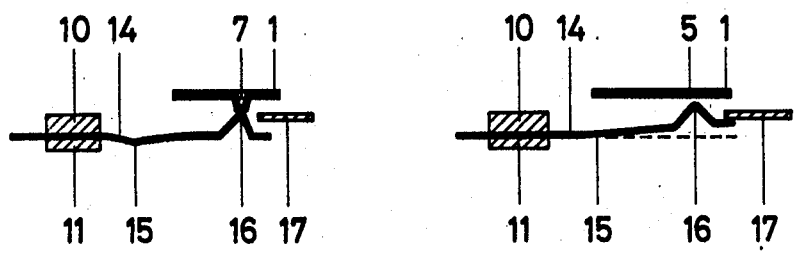
FIGS. 3 & 4 show a section through a contact in two different positions.

In FIG. 3 a contact is shown. This contact consists of a spring 14 made of phorphorus bronze and having a bend 15. The spring 14 is secured by a retaining plate 11, this retaining plate being fastened on a balk 10. Secured by the balk 10 and the retaining plate 11 the spring 14 is bent to bent to such a position that a knee 16 of the spring 14 is in electrical contact with a protrusion 7 on the coding member 1. However, in case there is no projection opposite to the knee 16, as shown in FIG. 4, a bar 17 ensures a space between the projection and the coding member 1, thus opening the contact.

The balk 10 together with the retaining plate 11 carry a set of springs 14 corresponding to the set of imaginary circles in such a way that a knee 16 of a spring 14 is opposite to each intersection point between the radials and the circles. The set of springs 14 moreover include at least one spring opposite to which a not shown notch in the bar 17 ensures that this or these springs obtain permanent contact with the coding member 1.

It should be noted that the present invention is not limited to include a plane, circular coding member. The coding member may be shaped as a rectangular plate, sliding linearly in guiding members, or as a cylinder, pivotable around its axis. Furthermore, it should be noted that despite the fact that any condition demanded by authorities or other can be fulfilled using the coding member, separate switches may still be used for replacement or supplementation of a row of spaces.

What we claim is:

1. A coding member for programming of a radio communication apparatus, in which the frequency selected is synthesized using a programmable frequency divider with a dividing figure N, and in which the coding member may be secured in a number of positions using an indexing mechanism, each position corresponding to a communication channel, the above coding member being provided with a number of rows of spaces placed in a direction which is mainly perpendicular to that in which the coding member is moved when adjusted to a particular channel, and that the intersection points on the coding member between a radial corresponding to a communication channel and a row of spaces will be a code combination selected from different mechanical code representations from a group of code representations which include empty spaces, empty spaces each with a threaded hole and projections, and some of the projections are permanent and some of the projections are semi-permanent so that expressions of mechanical coding will include binary codes in both permanent and semi-permanent mechanical representation along each radial and whereby the presence of a projection in any row in a radial can be used to close a corresponding contact in a set of contacts corresponding to the number of rows of spaces.

2. A coding member according to claim 1, in which the coding member is a plane, circular disc, pivotable around an axis, said axis being perpendicular to and protruding through the center of the disc, the periphery of which is provided with notches which function in connection with indexing mechanism.

3. A coding member according to claim 1, in which each semi-permanent projection consists of a screw mounted in a selected threaded hole in the coding member.

4. A coding member according to claim 1, in which a number of radials on the coding member are provided with threaded holes, at least where the intersection points of the combinations decide the dividing figure N.

5. A coding member according to claim 1, in which the permanent projections are constituted by deformation of the coding member.

6. A coding member according to claim 5, wherein said coding member is a plane circular disc and the projections are pressed-up protrusions in the disc.

* * * * *